United States Patent
Kim et al.

(10) Patent No.: US 10,645,805 B2
(45) Date of Patent: May 5, 2020

(54) MULTI-LAYER FLEXIBLE METAL-CLAD LAMINATE AND MANUFACTURING METHOD THEREOF

(71) Applicant: NEXFLEX CO., LTD., Seoul (KR)

(72) Inventors: Ho Sub Kim, Daejeon (KR); Byoung Wook Jo, Daejeon (KR); Young Do Kim, Daejeon (KR); Weon Jung Choi, Daejeon (KR); Dae Nyoun Kim, Daejeon (KR); Seung Jeong Kook, Daejeon (KR)

(73) Assignee: NEXFLEX CO., LTD., Seoul (KR)

( * ) Notice: Subject to any disclaimer, the term of this patent is extended or adjusted under 35 U.S.C. 154(b) by 342 days.

(21) Appl. No.: 14/654,795

(22) PCT Filed: Dec. 19, 2013

(86) PCT No.: PCT/KR2013/011871
§ 371 (c)(1),
(2) Date: Jun. 22, 2015

(87) PCT Pub. No.: WO2014/098495
PCT Pub. Date: Jun. 26, 2014

(65) Prior Publication Data
US 2015/0373843 A1    Dec. 24, 2015

(30) Foreign Application Priority Data
Dec. 21, 2012    (KR) ........................ 10-2012-0150559

(51) Int. Cl.
*H05K 1/03*    (2006.01)
*B32B 15/08*    (2006.01)
(Continued)

(52) U.S. Cl.
CPC ............. *H05K 1/036* (2013.01); *B32B 15/08* (2013.01); *B32B 15/20* (2013.01); *B32B 27/08* (2013.01);
(Continued)

(58) Field of Classification Search
CPC .................. H05K 1/036; H05K 3/022; H05K 2201/0195; H05K 2201/0154;
(Continued)

(56) References Cited

U.S. PATENT DOCUMENTS 5,800,930 A    9/1998    Chen et al.
5,897,761 A    4/1999    Tagusari et al.
(Continued)

FOREIGN PATENT DOCUMENTS

| | | |
|---|---|---|
| CN | 1425559 | 6/2003 |
| JP | 2005-206915 | 8/2005 |

(Continued)

OTHER PUBLICATIONS

Kalogeras, Ioannis M., and Witold Brostow. "Glass transition temperatures in binary polymer blends." Journal of Polymer Science Part B: Polymer Physics 47.1 (2009): 80-95. (Year: 2009).*

(Continued)

*Primary Examiner* — Michael Zhang
(74) *Attorney, Agent, or Firm* — IP & T Group LLP

(57) ABSTRACT

Provided are a multi-layer flexible metal-clad laminate, and a manufacturing method thereof, and more particularly, a multi-layer flexible metal-clad laminate in which at the time of manufacturing a multi-layer polyimide film on a surface of a metal-clad having a predetermined surface roughness value (Rz, Ra) and having roughening particles having a predetermined size or less attached thereon, a multi-coating scheme is used to form each polyimide mixed layer, such that a light reflection on a surface of the polyimide film and (Continued)

a light reflection generated at an interlayer interface of the polyimide in the multi-layer polyimide film are decreased to have an improved light transmittance of a polyimide laminate film after the metal-clad is removed, and a manufacturing method thereof.

11 Claims, 1 Drawing Sheet

(51) Int. Cl.
*C09D 179/08* (2006.01)
*B32B 27/08* (2006.01)
*B32B 15/20* (2006.01)
*B32B 27/28* (2006.01)
*H05K 3/02* (2006.01)

(52) U.S. Cl.
CPC .......... *B32B 27/281* (2013.01); *C09D 179/08* (2013.01); *H05K 3/022* (2013.01); *B32B 2250/40* (2013.01); *B32B 2307/538* (2013.01); *B32B 2457/08* (2013.01); *H05K 2201/0108* (2013.01); *H05K 2201/0154* (2013.01); *H05K 2201/0195* (2013.01); *Y10T 156/10* (2015.01); *Y10T 428/24355* (2015.01)

(58) Field of Classification Search
CPC .......... H05K 2201/0108; C09D 179/08; Y10T 428/24355; Y10T 156/10; B32B 27/281; B32B 27/08; B32B 27/538; B32B 15/20; B32B 15/08; B32B 2250/40; B32B 2457/08
See application file for complete search history.

(56) References Cited

U.S. PATENT DOCUMENTS

| | | |
|---|---|---|
| 6,117,300 A | 9/2000 | Carbin et al. |
| 2003/0072129 A1 | 4/2003 | Kuwako et al. |
| 2004/0110015 A1* | 6/2004 | Narui ...................... B32B 15/08 428/458 |
| 2005/0249927 A1* | 11/2005 | Suzuki .................... B32B 15/08 428/209 |
| 2010/0255324 A1* | 10/2010 | Yoo ....................... H05K 1/0346 428/458 |
| 2012/0205146 A1 | 8/2012 | Oguro et al. |
| 2012/0308816 A1* | 12/2012 | Kohama ................. B32B 15/08 428/354 |
| 2013/0040162 A1* | 2/2013 | Fujisawa ................ B32B 15/01 428/607 |

FOREIGN PATENT DOCUMENTS

| | | | | |
|---|---|---|---|---|
| JP | 2006210689 A * | 8/2006 | | |
| JP | 2007-216688 | 8/2007 | | |
| JP | 2010-155360 | 7/2010 | | |
| JP | 2010-228190 | 10/2010 | | |
| JP | WO 2011090174 A1 * | 7/2011 | ............. | B32B 15/01 |
| KR | 10-2012-0135197 | 11/2012 | | |
| KR | 1020120123389 | 11/2012 | | |
| KR | 10-2012-0123542 | 12/2012 | | |
| KR | 10-2004-0010270 | 1/2014 | | |
| WO | WO 01/28767 | 4/2001 | | |
| WO | WO-2011090174 A1 * | 7/2011 | ............. | B32B 15/01 |

OTHER PUBLICATIONS

EPO Translation of JP 2006-210689 (Year: 2018).*

Office Action issued by the Japanese Patent Office dated Sep. 20, 2017.

Office Action issued by the State Intellecutal Property Office dated Jan. 11, 2017.

Office Action issued by the Japanese Patent Office dated May 16, 2018.

* cited by examiner

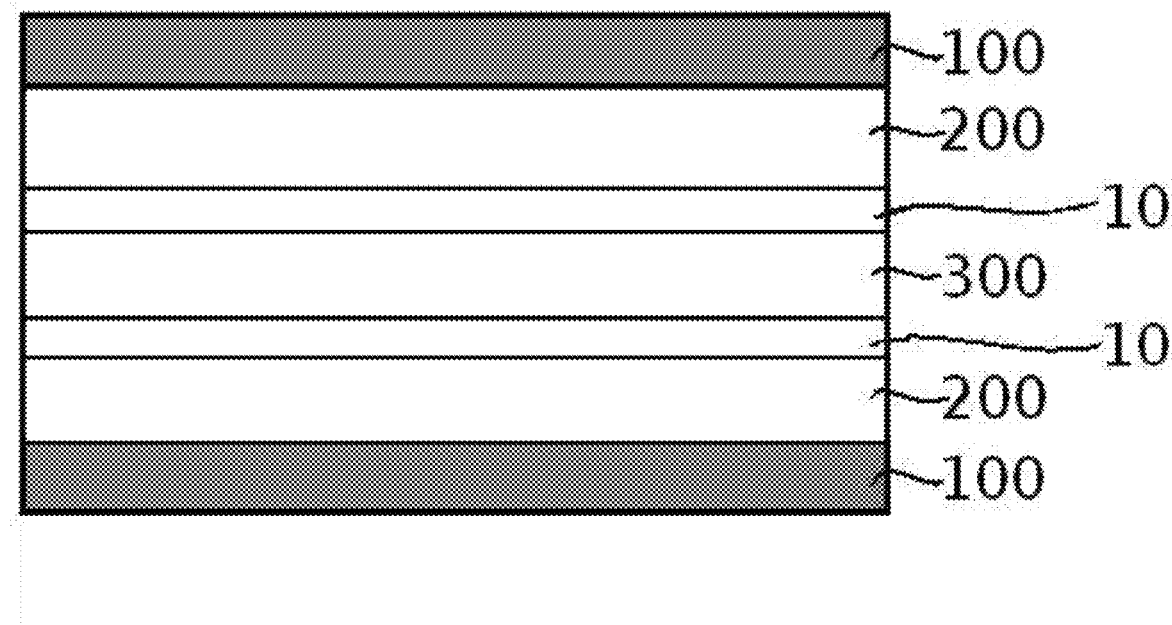

MULTI-LAYER FLEXIBLE METAL-CLAD LAMINATE AND MANUFACTURING METHOD THEREOF

This application is a national stage application of PCT/KR2013/011871 filed on Dec. 19, 2013, which claims priority of Korean patent application number 10-2012-0150559 filed on Dec. 21, 2012. The disclosure of each of the foregoing applications is incorporated herein by reference in its entirety.

TECHNICAL FIELD

The present invention relates to a multi-layer flexible metal-clad laminate, and a manufacturing method thereof, and more particularly, to a multi-layer flexible metal-clad laminate in which at the time of manufacturing a multi-layer polyimide film on a surface of a metal-clad having a predetermined surface roughness value (Rz, Ra) and having roughening particles having a predetermined size or less attached thereon, a multi-coating scheme is used to form each polyimide mixed layer, such that a light reflection on a surface of the polyimide and a light reflection generated at an interlayer interface of the polyimide in the multi-layer polyimide film are decreased to have an improved light transmittance of a polyimide laminate film after the metal-clad is removed, and a manufacturing method thereof.

BACKGROUND ART

A flexible metal-clad laminate used in manufacturing a flexible printed circuit board, which is a laminate of a conductive metal clad and an insulating resin, may be subject to a micro-circuit processing and may be bent in a narrow space. Therefore, the flexible metal-clad laminate has been increasingly utilized for a notebook computer, a personal digital assistant, a miniaturized video camera, a storage disk, and the like, in accordance with the trend in which an electronic device has a small size and a light weight. It is general that the flexible metal-clad laminate has a two layered structure or a three layered structure.

In the case of the flexible metal-clad laminate having the three layered structure, a polyimide film is coupled with the metal-clad by using an epoxy-based or a urethane-based adhesive. In this case, heat resistant property and flame retardant property are deteriorated due to the adhesive layer, and since change in dimension during an etching process and a heat treatment process is large, problems may occur in manufacturing a printed circuit board. In order to overcome the above-described problem, a flexible metal-clad laminate having a two layered structure has been developed only by using thermoplastic polyimide and polyimide without using the adhesive and has been used.

The flexible metal-clad laminate having the two layered structure may be largely classified into a single-sided metal-clad laminate having the metal-clad and the polyimide film and a double-sided metal-clad laminate having the polyimide film between two layered metal-clads. Here, the polyimide film is generally formed of a multi-layer polyimide having two or more layers rather than a single layer, wherein the multi-layer polyimide includes polyimide having different coefficient of linear thermal expansion in order to satisfy properties such as adhesion with the metal-clad, dimensional stability, and the like. In the flexible metal-clad laminate including the multi-layer polyimide film having two or more layers, warpage and a curl between the metal-clad and the polyimide laminate may be prevented, and physical properties such as adhesion strength, mechanical physical property, and electrical property may be improved.

Korean Laid-Open Patent Publication No. 10-2012-0123389 (Patent Document 1) discloses a flexible metal laminated board using a multi-layer polyimide film and having a thermoplastic polyimide layer formed on at least one side of a non-thermoplastic polyimide layer.

In order to generally form the multi-layer polyimide film used in the flexible metal-clad laminate, there are a method that a thermoplastic polyamic acid is applied and dried onto the previously manufactured polyimide film, followed by heating at a high temperature, and a method that a polyamic acid is applied and dried onto the metal-clad as many as the number of layers to be laminated, followed by heating at a high temperature.

In the case of using the above-described methods, since a thermosetting is partially performed on a surface of a polyimide precursor layer in a drying process, upper and lower polyimide precursor solutions are not mixed in an interface but each interlayer interface is clearly differentiated in the case of applying another polyimide precursor solution on the surface of the dried polyimide precursor layer. In this case, an inner turbidity of the polyimide film is increased and a light transmittance is hindered due to the reflection at the interlayer interface of the polyimide.

Recently, a scheme that a light source is used to penetrate the polyimide film through the board, thereby confirming a bonding position and coupling with the flexible circuit board and a module has been used in coupling the flexible circuit board and the module, such that in the case of using the polyimide having a low light transmittance, time required for recognizing the bonding position may be increased and a bonding defect between the flexible circuit board and the module may occur after the bonding, that is, a yield may be deteriorated. Therefore, a metal-clad laminate in which a light reflection on the surface of the polyimide film and a light reflection generated at the interlayer interface of the polyimide in the multi-layer polyimide film are remarkably decreased to have an improved light transmittance after the metal-clad is removed has been demanded.

(Patent Document 1) Korean Laid-Open Patent Publication No. 10-2012-0123389

TECHNICAL PROBLEM

In order to solve the above-described problems, a method in which inner turbidity and surface turbidity of a polyimide film used in a flexible metal-clad laminate are decreased is required. In general, in order to increase an adhesion with the polyimide, roughening particles (nodules) are coupled with a surface of the metal-clad used in the flexible metal-clad laminate to provide a roughness formed on the surface. Therefore, the roughness present on the surface of the metal-clad is transferred on the surface of the polyimide film to produce a surface turbidity of the polyimide film used in the flexible metal-clad laminate in manufacturing the flexible metal-clad laminate and a diffused reflection of the light is generated on the surface due to the roughness, such that a light transmittance is deteriorated. Therefore, in order for the polyimide film to obtain a predetermined or more light transmittance after the metal-clad is removed, an object of the present invention is to provide a multi-layer flexible metal-clad laminate using the metal-clad having a predetermined surface roughness value (Rz, Ra) and having roughening particles having a predetermined size or less attached thereon.

In addition, another object of the present invention is to provide a multi-layer flexible metal-clad laminate by continuously forming each layer without performing a drying process when applying a polyimide precursor solution, such that an interlayer interface of the polyimide in the multi-layer polyimide film may be suppressed from being formed to decrease a light reflection on the interface, whereby the inner turbidity of the multi-layer polyimide film may be decreased to have a high light transmittance.

TECHNICAL SOLUTION

In one general aspect, a multi-layer flexible metal-clad laminate includes: a metal-clad laminated on one surface or both surfaces of a multi-layer polyimide film, wherein the multi-layer polyimide film includes an $n^{th}$ polyimide layer, an $n+1^{th}$ polyimide layer, and a mixed layer of the $n^{th}$ polyimide layer and the $n+1^{th}$ polyimide layer, and the metal-clad satisfies the following Equations 1 to 3:

$0.1 \leq Rz^M \leq 1.5$ [Equation 1]

$0.01 \leq Ra^M \leq 0.3$ [Equation 2]

$0.01 \leq Dp^M \leq 0.25$ [Equation 3]

(wherein n is an integer selected from 1 to 10, in Equation 1, $Rz^M$ is a surface roughness (Rz) of a metal-clad surface adjacent to a polyimide layer, in Equation 2, $Ra^M$ is a surface roughness (Ra) of a metal-clad surface adjacent to a polyimide layer, in Equation 3, $Dp^M$ is an average particle size of roughening particles formed on the metal-clad surface adjacent to the polyimide layer, and each unit thereof is μm). The roughness Rz may mean a ten-point average roughness and the surface roughness Ra may mean an arithmetic average roughness.

The mixed layer of the $n^{th}$ polyimide layer and the $n+1^{th}$ polyimide layer may satisfy the following Equations 4 and 5:

$Min(CTE^n, CTE^{n+1}) \leq CTE^M \leq Max(CTE^n, CTE^{n+1})$ [Equation 4]

$Min(Tg^n, Tg^{n+1}) \leq Tg^M \leq Max(Tg^n, Tg^{n+1})$ [Equation 5]

(wherein n is an integer selected from 1 to 10, in Equation 4, $CTE^n$ is a coefficient of linear thermal expansion of the $n^{th}$ polyimide layer, $CTE^{n+1}$ is a coefficient of linear thermal expansion of the $n+1^{th}$ polyimide layer, $CTE^M$ is a coefficient of linear thermal expansion of the mixed layer of the $n+1^{th}$ polyimide layer and the $n+1^{th}$ polyimide layer, Min $(CTE^n, CTE^{n+1})$ is the minimum of $CTE^n$ and $CTE^{n+1}$, and Max $(CTE^n, CTE^{n+1})$ is the maximum of $CTE^n$ and $CTE^{n+1}$, and in Equation 5, $Tg^n$ is a glass transition temperature of the $n^{th}$ polyimide layer, $Tg^{n+1}$ is a glass transition temperature of the $n+1^{th}$ polyimide layer, $Tg^M$ is a glass transition temperature of the mixed layer of the $n^{th}$ polyimide layer and the $n+1^{th}$ polyimide layer, Min $(Tg^n, Tg^{n+1})$ is the minimum of $Tg^n$ and $Tg^{n+1}$, and Max $(Tg^n, Tg^{n+1})$ is the maximum of $Tg^n$ and $Tg^{n+1}$).

The metal-clad may be any one selected from copper, aluminum, iron, silver, palladium, nickel, chromium, molybdenum, tungsten or alloys thereof, and each layer of the multi-layer polyimide film may have a thickness of 1 to 30 μm.

The multi-layer polyimide film may satisfy the following Equations 6 and 7:

$0.5 Rz^M \leq Rz^P \leq 1.0 Rz^M$ [Equation 6]

$0.5 Ra^M \leq Ra^P \leq 1.0 Ra^M$ [Equation 7]

(in Equation 6, $Rz^P$ is a surface roughness (Rz) of the multi-layer polyimide film and $Rz^M$ is a surface roughness (Rz) of the metal-clad adjacent to the polyimide layer, and in Equation 7, $Ra^P$ is a surface roughness (Ra) of the multi-layer polyimide film and $Ra^M$ is a surface roughness (Ra) of the metal-clad adjacent to the polyimide layer). The roughness Rz may mean a ten-point average roughness and the surface roughness Ra may mean an arithmetic average roughness.

The multi-layer polyimide film obtained by removing the metal-clad from the multi-layer flexible metal-clad laminate may satisfy the following Equations 8 and 9:

$25 \leq Tp \leq 90$ [Equation 8]

$0 \leq Haze \leq 60$ [Equation 9]

(in Equation 8, Tp is a transmittance (%) of a straight light of the multi-layer polyimide film measured after the metal-clad is removed, and in Equation 9, Haze is turbidity (%) of the multi-layer polyimide film measured after the metal-clad is removed).

In another general aspect, a manufacturing method of a multi-layer flexible metal-clad laminate including a metal-clad laminated on one surface or both surfaces of a multi-layer polyimide film, the manufacturing method includes: laminating an $n^{th}$ polyimide layer and an $n+1^{th}$ polyimide layer on one surface of the metal-clad satisfying the following Equations 1 to 3 without performing a drying process to form a multi-layer polyimide layer having a mixed layer of the $n^{th}$ polyimide layer and the $n+1^{th}$ polyimide layer:

$0.1 \leq Rz^M \leq 1.5$ [Equation 1]

$0.01 \leq Ra^M \leq 0.3$ [Equation 2]

$0.01 \leq Dp^M \leq 0.25$ [Equation 3]

(wherein n is an integer selected from 1 to 10, in Equation 1, $Rz^M$ is a surface roughness (Rz) of a metal-clad surface adjacent to a polyimide layer, in Equation 2, $Ra^M$ is a surface roughness (Ra) of a metal-clad surface adjacent to a polyimide layer, in Equation 3, $Dp^M$ is an average particle size of roughening particles formed on the metal-clad surface adjacent to the polyimide layer, and each unit thereof is μm). The roughness Rz may mean a ten-point average roughness and the surface roughness Ra may mean an arithmetic average roughness.

The metal-clad may be any one selected from copper, aluminum, iron, silver, palladium, nickel, chromium, molybdenum, tungsten or alloys thereof, and the laminating may be performed by one or two or more coating methods selected from a knife coating, a roll coating, a slot-die coating, a lip-die coating, a slide coating, and a curtain coating.

A double-sided flexible metal-clad laminate may be manufactured by forming the multi-layer polyimide film on one surface of the metal-clad and then adhering the multi-layer polyimide film and a second metal-clad by a laminating method.

ADVANTAGEOUS EFFECTS

With the multi-layer flexible metal-clad laminate and the manufacturing method thereof according to the present invention, the metal-clad having a predetermined surface roughness value (Rz, Ra) and having roughening particles having a predetermined size or less attached thereon may be used to control the surface roughness generated by being transferred on the surface of the polyimide film from the surface roughness of the metal-clad, such that the surface turbidity of the multi-layer polyimide film may be decreased.

In addition, at the time of forming the multi-layer polyimide film on the surface of the metal-clad, the multi-coating scheme that each layer is continuously formed without performing the drying process is adopted, such that the light reflection generated at the interlayer interface of the polyimide may be suppressed to decrease the inner turbidity and due to the decreased surface turbidity and the decreased inner turbidity, the light transmittance of the polyimide film may be remarkably improved after the metal-clad is removed.

DESCRIPTION OF DRAWINGS

The above and other objects, features and advantages of the present invention will become apparent from the following description of preferred embodiments given in conjunction with the accompanying drawings, in which:

FIG. 1 shows a multi-layer flexible metal-clad laminate according to the present invention.

DETAILED DESCRIPTION OF MAIN ELEMENTS

100: Metal-clad
200: First Polyimide Layer
300: Second Polyimide Layer
10: Mixed Layer of First Polyimide Layer and Second Polyimide Layer

BEST MODE

In a research in a manufacturing method of a multi-layer flexible metal-clad laminate having a high light transmittance of a polyimide film after the metal-clad is removed, the present inventors found that an average size of particles used for a roughening treatment of a metal-clad as well as a surface roughness (Rz, Ra) of the metal-clad to be used remarkably affect a light transmittance.

In addition, the present inventors found that reflection generated at an interlayer interface of the multi-layer polyimide film is a factor hindering the light transmittance, and in order to prevent the factor, a multi-coating scheme is used to decrease a light reflection generated at the interlayer of the multi-layer polyimide film, thereby completing the present invention.

Hereinafter, a multi-layer flexible metal-clad laminate according to an exemplary embodiment of the present invention will be described in detail with reference to the accompanying drawings.

The present invention relates to a multi-layer flexible metal-clad laminate by laminating an $n^{th}$ polyimide layer and an $n+1^{th}$ polyimide layer on one surface of the metal-clad having a predetermined surface roughness value (Rz, Ra) and having roughening particles having a predetermined size or less attached thereon without performing a drying process and laminating a multi-layer polyimide having a mixed layer of the $n^{th}$ polyimide layer and the $n+1^{th}$ polyimide layer (wherein n is an integer selected from 1 to 10) to decrease the light reflection on the surface of the multi-layer polyimide film and at the interlayer interface of the polyimide in the multi-layer polyimide film, thereby having an improved light transmittance, and a manufacturing method thereof.

The metal-clad according to the exemplary embodiment of the present invention is not limited, but may be selected from copper, aluminum, iron, silver, palladium, nickel, chromium, molybdenum, tungsten or alloys thereof, and in particular, an electrolytic copper foil or a rolled copper foil among copper-based metal-clads having excellent adhesion strength with the multi-layer polyimide film is preferred.

In the case of forming the flexible metal-clad laminate on the above-described metal-clad using the polyimide by a casting scheme or a laminating scheme, surface roughness of the polyimide film is formed due to the roughening particles present on the surface of the metal-clad. Therefore, in order to increase the light transmittance of the polyimide film after the metal-clad is removed from the flexible metal-clad laminate, it is significantly important for the roughening particle present on the surface of the used metal-clad to have a predetermined size or less.

Accordingly, it is preferred to satisfy the following Equations 1 to 3 so as to decrease surface turbidity of the multi-layer polyimide film:

$$0.1 \leq Rz^M \leq 1.5 \quad \text{[Equation 1]}$$

$$0.01 \leq Ra^M \leq 0.3 \quad \text{[Equation 2]}$$

$$0.01 \leq Dp^M \leq 0.25 \quad \text{[Equation 3]}$$

(In Equation 1, $Rz^M$ is a surface roughness (Rz) of a metal-clad surface adjacent to a polyimide layer, in Equation 2, $Ra^M$ is a surface roughness (Ra) of a metal-clad surface adjacent to a polyimide layer, in Equation 3, $Dp^M$ is an average particle size of roughening particles formed on the metal-clad surface adjacent to the polyimide layer, and each unit thereof is μm).

Here, the surface roughness Rz is calculated by measuring degree of small prominence and depression on the surface of the metal-clad adjacent to the multi-layer polyimide by a ten-point average roughness calculation, wherein among all surface factors in the measured section (measured length), five points in sequence from the highest position and five points in sequence from the deepest position based on an average line of the measured section are used to calculate an average distance value from an average line of each five point, and a difference is represented by a micro unit (μm).

In addition, the surface roughness Ra, which means an arithmetic average roughness, is obtained by calculating the sum of the entire area including upper and lower areas based on the centerline of the measured section (measured length) and dividing the calculated value by the length of the measured section and is represented by a micro unit (μm).

The surface roughness Rz and Ra were measured using a contact type surface roughness measuring device (SJ-401) manufactured by Mitutoyo Corporation, wherein the stylus had a radius of curvature of 2 μm, a cut-off had a length of 0.8 mm, a measuring length was 4 mm, and a scanning rate was 0.1 mm/s.

In the case in which each of the surface roughness (Rz, Ra) of the metal-clad and the size of the particle used for roughening treatment of the metal-clad is more than the above-described range, the surface roughness of the metal-clad is transferred on the surface of the multi-layer polyimide film, and a diffused reflection of the light is extremely generated on the surface of the polyimide film due to the transferred surface roughness, such that the light transmittance may be deteriorated.

In addition, in the case in which each of the surface roughness (Rz, Ra) of the metal-clad and the size of the particle used for roughening treatment of the metal-clad is less than the above-described range, adhesion strength between the metal-clad and the multi-layer polyimide may be deteriorated.

It is preferred to use the multi-coating scheme as described below in order to decrease an inner turbidity of the multi-layer polyimide film. According to the multi-coating scheme, after a polyimide precursor solution is applied on the metal-clad, another polyimide precursor solution that is the same as or different from the used polyimide precursor solution is applied again without performing a drying process, the above-described processes are repeated so that a number of polyimide precursor solutions are continuously laminated, and the solvent is finally dried once. The adjacent polyimide precursor solutions that are the same as each other or different from each other are mixed through diffusion between the precursor solution in applying the polyimide precursor solution, such that the multi-layer polyimide precursor layer manufactured as described above has the following structure: the $n^{th}$ polyimide precursor layer/the mixed layer of the $n^{th}$ polyimide precursor layer and the $n+1^{th}$ polyimide precursor layer/the $n+1^{th}$ polyimide precursor layer (wherein n is an integer selected from 1 to 10). Then, the following structure: the $n^{th}$ polyimide layer/the mixed layer of the $n^{th}$ polyimide layer and the $n+1^{th}$ polyimide layer/the $n+1^{th}$ polyimide layer may be obtained by thermosetting (imidization). In this case, a clear boundary between the $n^{th}$ polyimide layer and the $n+1^{th}$ polyimide layer is not formed, such that the light reflection is decreased at the interlayer interface of the polyimide, whereby the inner turbidity of the multi-layer polyimide is decreased. Therefore, the multi-layer polyimide manufactured by the multi-coating scheme without performing a drying process has a high light transmittance.

The multi-layer polyimide according to the exemplary embodiment of the present invention is preferred to be a polyimide film having a two or more layered structure, and more preferably, a 2m−1 layered structure (wherein m is an integer selected from 2 to 10) to prevent warpage and curl and improve physical properties such as mechanical physical property, adhesion strength, and electrical property.

The polyimide precursor solution may be prepared by mixing dianhydride and diamine into an organic solvent at a molar ratio of 1:0.9 to 1:1.1. At the time of preparing the polyimide precursor solution of the present invention, a mixed ratio between dianhydride and diamine, a mixed ratio between dianhydrides, and a mixed ratio between diamines may be controlled or kinds of dianhydrides and diamines to be selected may be controlled, such that a polyimide-based resin having desired coefficient of thermal expansion (CTE) or glass transition temperature (Tg) may be obtained.

Therefore, in order to improve the light transmittance of the multi-layer polyimide film, it is preferred that the mixed layer of the $n^{th}$ polyimide layer and the $n+1^{th}$ polyimide layer satisfies the following Equations 4 and 5:

$$\text{Min}(CTE^n, CTE^{n+1}) \leq CTE^M \leq \text{Max}(CTE^n, CTE^{n+1}) \quad \text{[Equation 4]}$$

$$\text{Min}(Tg^n, Tg^{n+1}) \leq Tg^M \leq \text{Max}(Tg^n, Tg^{n+1}) \quad \text{[Equation 5]}$$

(wherein n is an integer selected from 1 to 10, in Equation 4, $CTE^n$ is a coefficient of linear thermal expansion of the $n^{th}$ polyimide layer, $CTE^{n+1}$ is a coefficient of linear thermal expansion of the $n+1^{th}$ polyimide layer, $CTE^M$ is a coefficient of linear thermal expansion of the mixed layer of the $n^{th}$ polyimide layer and the $n+1^{th}$ polyimide layer, Min ($CTE^n$, $CTE^{n+1}$) is the minimum of $CTE^n$ and $CTE^{n+1}$, and Max ($CTE^n$, $CTE^{n+1}$) is the maximum of $CTE^n$ and $CTE^{n+1}$, and in Equation 5, $Tg^n$ is a glass transition temperature of the $n^{th}$ polyimide layer, $Tg^{n+1}$ is a glass transition temperature of the $n+1^{th}$ polyimide layer, $Tg^M$ is a glass transition temperature of the mixed layer of the $n^{th}$ polyimide layer and the $n+1^{th}$ polyimide layer, Min ($Tg^n$, $Tg^{n+1}$) is the minimum of $Tg^n$ and $Tg^{n+1}$ and Max ($Tg^n$, $Tg^{n+1}$) is the maximum of $Tg^n$ and $Tg^{n+1}$).

As the dianhydride appropriate for the exemplary embodiment of the present invention, one or two or more kinds selected from a group consisting of pyromellitic dianhydride (PMDA), 3,3',4,4'-biphenyl tetracarboxylic dianhydride (BPDA), 3,3',4,4'-benzophenone tetracarboxylic dianhydride (BTDA), 4,4'-oxydiphtalic anhydride (ODPA), 4,4'-diamino diphenyl ether (ODA), 4,4'-(4,4'-isopropylbiphenoxy)biphthalic anhydride (BPADA), 2,2'-bis-(3,4-dicarboxyiphenyl) hexafluoropropane dianhydride (6FDA) and ethyleneglycol bis(anhydro-trimeliitate) (TMEG) may be used.

As the diamine appropriate for the exemplary embodiment of the present invention, one or two or more kinds selected from a group consisting of p-phenylenediamine (PDA), m-phenylenediamine (m-PDA), 4,4'-oxydianiline (4,4'-ODA), 3,4'-oxydianiline (3,4'-ODA), 2,2-bis(4-[4-aminophenoxy]-phenyl) propane (BAPP), 1,3-bis(4-aminophenoxy)benzene (TPE-R), 4,4'-bis(4-aminophenoxy) biphenyl (BAPB), 2,2-bis(4-[3-aminophenoxy]phenyl) sulfone (m-BAPS), 3,3'-dihydroxy-4,4'-diaminobiphenyl (HAB), and 4,4'-diaminobenzanilide (DABA) may be used.

Another dianhydride or diamine rather than the above-described compound or the other compounds may be added in a small amount as needed.

The organic solvent appropriate for preparing the polyimide precursor solution may be selected from a group consisting of N-methyl pyrrolidinone (NMP), N,N-dimethylacetamide (DMAc), tetrahydrofuran (THF), N,N-dimethylformamide (DMF), dimethylsulfoxide (DMSO), cyclohexane, acetonitrile, and mixtures thereof, but is not limited thereto.

The polyimide precursor solution is preferred to have a solid content of 5 to 30 wt % based on the entire solution, and in the case in which the solid content is less than 5 wt %, the solvent is unnecessarily and largely used to decrease economical efficiency and in the case in which the solid content is more than 30 wt %, the solution has an extremely high density, thereby having difficulty in being uniformly applied.

In addition, in order to be easily applied or hardened or to improve other physical properties, additives such as an anti-forming agent, an anti-gel forming agent, and a curing accelerator may be further added.

It is preferred that each layer in the multi-layer polyimide film according to the exemplary embodiment of the present invention has a thickness of 1 to 30 μm. In the case in which each layer has a thickness less than 1 μm, the layer may have difficulty in being applied by a general coating scheme, and in the case in which each layer has a thickness of more than 30 μm, curl or warpage of the film due to evaporation of the solvent at the time of being dried and cured may be intensified.

As described above, the multi-layer flexible metal-clad laminate having the multi-layer polyimide film laminated by the multi-coating scheme on one surface of the metal-clad having the predetermined surface roughness value (Rz, Ra) and having roughening particles having the predetermined size or less attached thereon satisfies the following Equations 6 and 7 to have excellent adhesion strength between the metal-clad and the multi-layer polyimide film and the improved transmittance, which is preferred:

$$0.5Rz^M \leq Rz^P \leq 1.0Rz^M \quad \text{[Equation 6]}$$

$$0.5Ra^M \leq Ra^P \leq 1.0Ra^M \quad \text{[Equation 7]}$$

(in Equation 6, $Rz^M$ is a surface roughness (Rz) of the multi-layer polyimide film and $Rz^M$ is a surface roughness (Rz) of the metal-clad adjacent to the polyimide layer, and in Equation 7, $Ra^P$ is a surface roughness (Ra) of the multi-layer polyimide film and $Ra^M$ is a surface roughness (Ra) of the metal-clad adjacent to the polyimide layer). The surface roughness Rz means a ten-point average roughness and the surface roughness Ra means an arithmetic average roughness.

As a laminating method applicable to the present invention, the same kind or two different kinds of coating methods selected from a knife coating, a roll coating, a slot die coating, a lip die coating, a slide coating, and a curtain coating are sequentially used twice or more or a multi die coating method is used for continuous lamination, but the present invention is not limited thereto.

A process of coating the polyimide precursor layer on the metal-clad, a drying process, and a curing process may be selectively used, and various known methods such as a hot wind curing method, an infrared curing method, a batch type curing method, a continuous type curing method, and a chemical curing method may be used.

A double-sided flexible metal-clad laminate having the metal-clads formed on both surfaces of the multi-layer polyimide film may be manufactured by forming the multi-layer polyimide film on one surface of a first metal-clad and then adhering a second metal-clad on the multi-layer polyimide film using a laminating method. As the laminating method applicable to the present invention, various known methods such as a high temperature roll laminator, a high temperature press, and a high temperature belt press may be used. In addition, as long as the second metal-clad is a metal-clad known in the art, the metal-clad is not limited, and preferably, it is effective to be selected from the above-described metal-clads.

The multi-layer flexible metal-clad laminate manufactured by the above-described manufacturing method thereof may control the surface roughness formed by being transferred on the multi-layer polyimide film depending on the predetermined surface roughness of the metal-clad and the average particle size of the roughening particle, such that the light reflection generated by the surface roughness may be decreased, and the multi-layer polyimide film is formed by the multi-coating scheme, such that the light reflection generated at the interlayer interface of the polyimide may be suppressed, whereby the light transmittance may be remarkably improved.

Hereinafter, the present invention will be described in detail by describing more specific examples and comparative examples below. However, the present invention is not limited to the following examples and comparative examples but various examples may be achieved within the accompanying claims. These examples may be provided so that this invention will be complete and will be easily practiced by a person skilled in the art to which the present invention pertains.

The abbreviations used in the following Examples are as follows.

DMAc: N,N-dimethylacetamide
BPDA: 3,3',4,4'-biphenyltetracarboxylic acid dianhydride
PDA: p-phenylenediamine
ODA: 4,4'-diaminodiphenylether
TPE-R: 1,3-bis(4-aminophenoxy)benzene Physical properties disclosed in the present invention followed the next measuring methods.

1. Measurement of Light Transmittance

After a multi-layer flexible metal-clad laminate was etched and cut in a positive direction so as to have each length and width of 5 cm, a haze meter was used to measure a light transmittance by a JIS K7361 scheme and measure a haze value by a JIS K7136 scheme. In order to observe an inner turbidity of a polyimide film, coverlays were bonded to both sides of the film and then the transmittance and the haze value were measured by using the same method as described above.

2. Adhesion Strength Between Multi-Layer Polyimide Film and Metal-Clad

In order to measure adhesion strength between the multi-layer polyimide film and the metal-clad, the metal-clad of the multi-layer flexible metal-clad laminate was patterned in a width of 1 mm and then 180° peel strength was measured using a universal testing machine (UTM).

3. Measurement of Surface Roughness of Metal-Clad and Size of Roughening Particle The surface roughness of the metal-clad was measured by a JIS1994 scheme. An average size of the roughening particle on the surface of the metal-clad contacting the polyimide layer was measured using a scanning electron microscope. The surface roughness Rz and Ra were measured using a contact type surface roughness measuring device (SJ-401) manufactured by Mitutoyo Corporation, wherein stylus had a radius of curvature of 2 μm, a cut-off had a length of 0.8 mm, a measuring length was 4 mm, and a scanning rate was 0.1 mm/s.

4. Coefficient of Thermal Expansion (CTE)

A coefficient of thermal expansion was obtained by raising a temperature up to 400° C. at a rate of 10° C. per a minute and calculating an average value between 100° C. and 200° C. among the measured coefficient of thermal expansion values by using a thermomechanical analyzer (TMA).

Synthesis Example 1

Diamine of TPE-R 2,226 g was agitated and completely dissolved into a DMAc solution 30,780 g under nitrogen atmosphere and BPDA 2,240 g as dianhydride was added thereto throughout several times. Thereafter, the agitation was continuously performed for about 24 hours to prepare a polyimide precursor (polyamic acid) solution. The prepared polyimide precursor solution was cast on a film having a thickness of 20 μm, followed by raising a temperature up to 350° C. for 60 minutes, and maintained and hardened for 30 minutes. The measured coefficient of thermal expansion and the measured glass transition temperature were 51.1 ppm/K and 232° C., respectively.

Synthesis Example 2

Diamine of PDA 1,638 g and ODA 758 g was agitated and completely dissolved into a DMAc solution 32,416 g under nitrogen atmosphere and BPDA 5,700 g as dianhydride was added thereto throughout several times. Thereafter, the agitation was continuously performed for about 24 hours to prepare a polyimide precursor (polyamic acid) solution. The prepared polyimide precursor solution was cast on a film having a thickness of 20 μm, followed by raising a temperature up to 350° C. for 60 minutes, and maintained and hardened for 30 minutes. The measured coefficient of thermal expansion and the measured glass transition temperature were 13.3 ppm/K and 321° C., respectively.

Example 1

A first polyimide precursor solution prepared by [Synthesis Example 1], a second polyimide precursor solution prepared by [Synthesis Example 2], and another first polyimide precursor solution prepared by [Synthesis Example 1] were continuously coated on an electrolytic copper foil (Rz=1.2 μm) having a thickness of 12 μm by using a multi slot die so as to have each thickness of 4.0 μm, 13.0 μm and 3.0 μm after being cured. Then, a drying process was performed in a drier at a temperature of 150° C. The multi-layer polyimide precursor layers on the copper foil manufactured as described above were completely imidized under nitrogen atmosphere in accordance with a curing condition shown in the following Table 1 by using an infrared heating apparatus. The multi-layer polyimide layer on the copper foil manufactured as described above and the same copper foil as the previously used copper foil were adhered using a high temperature laminator to manufacture a double-sided multi-layer flexible metal-clad laminate having copper foils laminated on both sides of the multi-layer polyimide layer. Physical properties and light transmittance of the double-sided multi-layer flexible metal-clad laminate manufactured as described above were shown in the following Table 2.

Example 2

A double-sided multi-layer flexible metal-clad laminate was manufactured by the same method as Example 1 except for using a rolled copper foil (Rz=0.5 μm) having a thickness of 12 μm. Physical properties and light transmittance of the double-sided multi-layer flexible metal-clad laminate manufactured as described above were shown in the following Table 2.

Comparative Example 1

A first polyimide precursor solution prepared by [Synthesis Example 1], a second polyimide precursor solution prepared by [Synthesis Example 2], and another first polyimide precursor solution prepared by [Synthesis Example 1] were continuously coated on an electrolytic copper foil (Rz=2.0 μm) having a thickness of 12 μm by using a multi slot die so as to have each thickness of 4.0 μm, 13.0 μm and 3.0 μm after being cured. Then, a drying process was performed in a drier at a temperature of 150° C. The multi-layer polyimide precursor layers on the copper foil manufactured as described above were completely imidized under nitrogen atmosphere in accordance with a curing condition shown in the following Table 1 by using an infrared heating apparatus. The multi-layer polyimide layer on the copper foil manufactured as described above and the same copper foil as the previously used copper foil were adhered using a high temperature laminator to manufacture a double-sided multi-layer flexible metal-clad laminate having copper foil laminated on both sides of the multi-layer polyimide layer. Physical properties and light transmittance of the double-sided multi-layer flexible metal-clad laminate manufactured as described above were shown in the following Table 2.

Comparative Example 2

The first polyimide precursor solution prepared by [Synthesis Example 1] was applied on an electrolytic copper foil (Rz=2.0 μm) having a thickness of 12 μm so as to have a thickness of 4.0 μm after performing a final curing process, and dried at 150° C., thereby forming a first polyimide precursor layer. The second polyimide precursor solution prepared by [Synthesis Example 2] was applied on one surface of the first polyimide precursor layer so as to have a thickness of 13.0 μm after performing a final curing process, and dried at 150° C., thereby forming a second polyimide precursor layer. Then, the first polyimide precursor solution prepared by [Synthesis Example 1] was applied on one surface of the second polyimide precursor layer so as to have a thickness of 3.0 μm after performing a final curing process, and dried at 150° C., thereby forming a first polyimide precursor layer. The multi-layer polyimide precursor layers on the copper foil manufactured as described above were completely imidized under nitrogen atmosphere in accordance with a curing condition shown in the following Table 1 by using an infrared heating apparatus. The multi-layer polyimide layer on the copper foil manufactured as described above and the same copper foil as the previously used copper foil were adhered using a high temperature laminator to manufacture a double-sided multi-layer flexible metal-clad laminate having copper foils laminated on both sides of the polyimide layer. Physical properties and light transmittance of the double-sided multi-layer flexible metal-clad laminate manufactured as described above were shown in the following Table 2.

Comparative Example 3

A double-sided multi-layer flexible metal-clad laminate was manufactured by the same method as Comparative Example 2 except for using an electrolytic copper foil (Rz=1.2 μm) having a thickness of 12 μm. Physical properties and light transmittance of the double-sided multi-layer flexible metal-clad laminate manufactured as described above were shown in the following Table 2.

Comparative Example 4

A double-sided multi-layer flexible metal-clad laminate was manufactured by the same method as Comparative Example 2 except for using an electrolytic copper foil (Rz=1.1 μm) having a thickness of 12 μm. Physical properties and light transmittance of the double-sided multi-layer flexible metal-clad laminate manufactured as described above were shown in the following Table 2.

Comparative Example 5

A double-sided multi-layer flexible metal-clad laminate was manufactured by the same method as Comparative Example 2 except for using a rolled copper foil (Rz=1.1 μm) having a thickness of 12 μm. Physical properties and light transmittance of the double-sided multi-layer flexible metal-clad laminate manufactured as described above were shown in the following Table 2.

TABLE 1

|  | Production Rate | Time (min) Required for Raising Temperature From 150 To 300° C. | Residence time (min) at a temperature of 300° C. or more | Highest Curing Temperature (° C.) |
|---|---|---|---|---|
| Curing Condition | 3 m/min | 3.3 | 4.3 | 385 |

TABLE 2

|  | Metal-clad Adhesion (kgf/cm) | Metal-clad Roughness (μm) | | Average Particle Size of Roughening Particle (μm) | Transmittance (%) | | Whether or Not Coverlay is Bonded |
|---|---|---|---|---|---|---|---|
|  |  | Rz | Ra |  | Straight Light | Haze |  |
| Example 1 | 1.3 | 1.2 | 0.19 | 0.06 | 36 | 55 | X |
| Example 2 | 1.1 | 0.5 | 0.01 | 0.09 | 44 | 43 | X |
| Comparative Example 1 | 1.4 | 2.0 | 0.28 | 1.06 | 0.9 | 98 | X |
|  |  |  |  |  | 14 | 72 | O |
| Comparative Example 2 | 1.4 | 2.0 | 0.28 | 1.06 | 0.6 | 99 | X |
|  |  |  |  |  | 6 | 87 | O |
| Comparative Example 3 | 1.4 | 1.2 | 0.19 | 0.06 | 24 | 68 | X |
| Comparative Example 4 | 1.3 | 1.1 | 0.19 | 1.01 | 1.9 | 97 | X |
| Comparative Example 5 | 1.1 | 1.1 | 0.18 | 0.35 | 2.5 | 96 | X |

It may be appreciated from results between the Examples and the Comparative Examples in Table 2 above that in the case of the multi-layer flexible metal-clad laminate manufactured by the multi-coating scheme, transmittance of a straight light is high as compared to the multi-layer flexible metal-clad laminate manufactured by the existing coating scheme.

In addition, in the case in which the surface roughness of the metal-clad is high, since difference in transmittance is not remarkably shown due to the surface turbidity of the polyimide film, a coverlay is bonded to the film and then a comparison is conducted in view of an inner turbidity, confirming a large difference. Therefore, it may be appreciated that in the case of manufacturing the multi-layer polyimide film by using the multi-coating scheme, light reflection is decreased at an interface, such that the transmittance of the straight light is increased and the turbidity is decreased.

Further, it may be appreciated that as surface roughness value (Rz) of the metal-clad used in the multi-layer flexible metal-clad laminate becomes small, the transmittance of the straight light becomes increased. However, it may be appreciated that even though the metal-clad having similar surface roughness value (Rz) is used, the light transmittance may be largely changed depending on a size of the roughening particle coupled with the metal-clad. Therefore, it may be appreciated that in order to manufacture the multi-layer flexible metal-clad laminate having high light transmittance, a roughness size of the metal-clad to be used and the size of the roughening particle present in the surface are required to be taken into consideration together and the multi-coating scheme is used to form the multi-layer polyimide film, such that the multi-layer flexible metal-clad laminate having the improved light transmittance of the polyimide film after the metal-clad is removed may be manufactured.

The invention claimed is:

1. A multi-layer flexible metal-clad laminate comprising:
a metal foil laminated on one surface or both surfaces of a multi-layer polyimide film,
wherein the multi-layer polyimide film includes an $n^{th}$ polyimide layer, an $n+1^{th}$ polyimide layer, and a mixed layer of the $n^{th}$ polyimide layer and the $n+1^{th}$ polyimide layer,
wherein the metal foil includes a plurality of roughening particles attached on the metal foil surface adjacent to the multi-layer polyimide film,
wherein the metal foil satisfies the following Equations 1 to 3:

$$0.5 \leq Rz^M \leq 1.2 \quad \text{[Equation 1]}$$

$$0.01 \leq Ra^M \leq 0.19 \quad \text{[Equation 2]}$$

$$0.06 \leq Dp^M \leq 0.09 \quad \text{[Equation 3]}$$

wherein in Equation 1, $Rz^M$ is a ten-point average surface roughness (Rz) of the surface of the metal foil adjacent to the surface of the polyimide layer, in Equation 2, $Ra^M$ is an arithmetic average surface roughness (Ra) of the surface of the metal foil adjacent to the surface of the polyimide layer, in Equation 3, $Dp^M$ is an average particle size of roughening particles, and each unit thereof is μm, and n is an integer selected from 1 to 3, and wherein the multi-layer polyimide film obtained by removing the metal foil from the multi-layer flexible metal-clad laminate satisfies the following Equations 8 and 9:

$$25 \leq Tp \leq 90 \quad \text{[Equation 8]}$$

$$40 \leq Haze \leq 60 \quad \text{[Equation 9]}$$

wherein in Equation 8, Tp is a transmittance (%) of a straight light of the multi-layer polyimide film measured after the metal foil is removed, and in Equation 9, Haze is a turbidity (%) of the multi-layer polyimide film measured after the metal foil is removed.

2. The multi-layer flexible metal-clad laminate of claim 1, wherein the $n^{th}$ polyimide layer and the $n+1^{th}$ polyimide layer are laminated without performing a drying process to form the mixed layer of the $n^{th}$ polyimide layer and the $n+1^{th}$ polyimide layer between the $n^{th}$ polyimide layer and the $n+1^{th}$ polyimide layer.

3. The multi-layer flexible metal-clad laminate of claim 2, wherein the mixed layer of the $n^{th}$ polyimide layer and the $n+1^{th}$ polyimide layer satisfies the following Equations 4 and 5:

$$\text{Min}(CTE^n, CTE^{n+1}) \leq CTE^M \leq \text{Max}(CTE^n, CTE^{n+1}) \quad \text{Equation 4}$$

$$\text{Min}(Tg^n, Tg^{n+1}) \leq Tg^M \leq \text{Max}(Tg^n, Tg^{n+1}) \quad \text{Equation 5}$$

wherein
in Equation 4, $CTE^n$ is a coefficient of linear thermal expansion of the $n^{th}$ polyimide layer, $CTE^{n+1}$ is a coefficient of linear thermal expansion of the $n+1^{th}$ polyimide layer, $CTE^M$ is a coefficient of linear thermal expansion of the mixed layer of the $n^{th}$ polyimide layer and the $n+1^{th}$ polyimide layer, $\text{Min}(CTE^n, CTE^{n+1})$ is the minimum of $CTE^n$ and $CTE^{n+1}$, and $\text{Max}(CTE^n, CTE^{n+1})$ is the maximum of $CTE^n$ and $CTE^{n+1}$, and
in Equation 5, $Tg^n$ is a glass transition temperature of the $n^{th}$ polyimide layer, $Tg^{n+1}$ is a glass transition temperature of the $n+1^{th}$ polyimide layer, $Tg^M$ is a glass transition temperature of the mixed layer of the $n^{th}$ polyimide layer and the $n+1^{th}$ polyimide layer, $\text{Min}(Tg^n, Tg^{n+1})$ is the minimum of $Tg^n$ and $Tg^{n+1}$, and $\text{Max}(Tg^n, Tg^{n+1})$ is the maximum of $Tg^n$ and $Tg^{n+1}$.

4. The multi-layer flexible metal-clad laminate of claim 1, wherein the metal foil is any one selected from copper, aluminum, iron, silver, palladium, nickel, chromium, molybdenum, tungsten or alloys thereof.

5. The multi-layer flexible metal-clad laminate of claim 1, wherein each layer of the multi-layer polyimide film has a thickness of 1 to 30 μm.

6. The multi-layer flexible metal-clad laminate of claim 1, wherein the multi-layer polyimide film satisfies the following Equations 6 and 7:

$$0.5 Rz^M \leq Rz^P \leq 1.0 Rz^M \quad \text{Equation 6}$$

$$0.5 Ra^M \leq Ra^P \leq 1.0 Ra^M \quad \text{Equation 7}$$

and wherein in Equation 6, $Rz^P$ is a ten-point average surface roughness (Rz) of the multi-layer polyimide film and $Rz^M$ is the ten-point average surface roughness (Rz) of the surface of the metal foil adjacent to the surface of the polyimide layer, and in Equation 7, $Ra^P$ is an arithmetic average surface roughness (Ra) of the multi-layer polyimide film and $Ra^M$ is the arithmetic average surface roughness (Ra) of the surface of the metal foil adjacent to the surface of the polyimide layer.

7. A manufacturing method of a multi-layer flexible metal-clad laminate including a metal-clad laminated on one surface or both surfaces of a multi-layer polyimide film, the manufacturing method comprising:
laminating an $n^{th}$ polyimide layer and an $n+1^{th}$ polyimide layer on one surface of the metal-clad without performing a drying process to form a multi-layer polyimide layer having a mixed layer of the $n^{th}$ polyimide layer and the $n+1^{th}$ polyimide layer,
wherein the metal-clad includes a plurality of roughening particles attached to the surface of the metal-clad adjacent to the multi-layer polyimide film,
wherein the metal-clad satisfies the following Equations 1 to 3:

$$0.5 < Rz^M < 1.2 \quad \text{[Equation 1]}$$

$$0.01 < Ra^M < 0.19 \quad \text{[Equation 2]}$$

$$0.06 < Dp^M < 0.09 \quad \text{[Equation 3]}$$

wherein n is an integer selected from 1 to 3, in Equation 1, $Rz^M$ is a ten-point average surface roughness (Rz) of the surface of the metal-clad adjacent to the surface of the polyimide layer, in Equation 2, $Ra^M$ is an arithmetic average surface roughness (Ra) of the surface of the metal-clad adjacent to the surface of the polyimide layer, in Equation 3, $Dp^M$ is an average particle size of the roughening particles and each unit thereof is μm, and
wherein the multi-layer polyimide film obtained by removing the metal-clad from the multi-layer flexible metal-clad laminate satisfies the following Equations 8 and 9:

$$25 \leq Tp \leq 90 \quad \text{Equation 8}$$

$$40 \leq \text{Haze} \leq 60 \quad \text{Equation 9}$$

wherein in Equation 8, Tp is a transmittance (%) of a straight light of the multi-layer polyimide film measured after the metal-clad is removed, and in Equation 9, Haze is a turbidity (%) of the multi-layer polyimide film measured after the metal-clad is removed.

8. The manufacturing method of claim 7, wherein the mixed layer of the $n^{th}$ polyimide layer and the $n+1^{th}$ polyimide layer satisfies the following Equations 4 and 5:

$$\text{Min}(CTE^n, CTE^{n+1}) \leq CTE^M \leq \text{Max}(CTE^n, CTE^{n+1}) \quad \text{[Equation 4]}$$

$$\text{Min}(Tg^n, Tg^{n+1}) \leq Tg^M \leq \text{Max}(Tg^n, Tg^{n+1}) \quad \text{[Equation 5]}$$

(wherein n is an integer selected from 1 to 10,
in Equation 4, $CTE^n$ is a coefficient of linear thermal expansion of the $n^{th}$ polyimide layer, $CTE^{n+1}$ is a coefficient of linear thermal expansion of the $n+1^{th}$ polyimide layer, $CTE^M$ is a coefficient of linear thermal expansion of the mixed layer of the $n^{th}$ polyimide layer and the $n+1^{th}$ polyimide layer, $\text{Min}(CTE^n, CTE^{n+1})$ is the minimum of $CTE^n$ and $CTE^{n+1}$, and $\text{Max}(CTE^n, CTE^{n+1})$ is the maximum of $CTE^n$ and $CTE^{n+1}$, and
in Equation 5, $Tg^n$ is a glass transition temperature of the $n^{th}$ polyimide layer, $Tg^{n+1}$ is a glass transition temperature of the $n+1^{th}$ polyimide layer, $Tg^M$ is a glass transition temperature of the mixed layer of the $n^{th}$ polyimide layer and the $n+1^{th}$ polyimide layer, $\text{Min}(Tg^n, Tg^{n+1})$ is the minimum of $Tg^n$ and $Tg^{n+1}$, and $\text{Max}(Tg^n, Tg^{n+1})$ is the maximum of $Tg^n$ and $Tg^{n+1}$).

9. The manufacturing method of claim 7, wherein the metal-clad is any one selected from copper, aluminum, iron, silver, palladium, nickel, chromium, molybdenum, tungsten or alloys thereof.

10. The manufacturing method of claim 7, wherein the laminating is performed by one or two or more coating methods selected from a group consisting of a knife coating, a roll coating, a slot-die coating, a lip-die coating, a slide coating, and a curtain coating.

11. The manufacturing method of claim 7, wherein the multi-layer flexible metal-clad laminate is double-sided and is manufactured by forming the multi-layer polyimide film on one surface of the metal-clad and then adhering the multi-layer polyimide film and a second metal-clad by a laminating method.

* * * * *